US010753995B2

(12) United States Patent
Sohn et al.

(10) Patent No.: US 10,753,995 B2
(45) Date of Patent: Aug. 25, 2020

(54) SYSTEM AND METHOD FOR SIMULTANEOUS RADIO FREQUENCY TRANSMISSION AND RECEPTION IN MAGNETIC RESONANCE IMAGING

(71) Applicant: REGENTS OF THE UNIVERSITY OF MINNESOTA, St. Paul, MN (US)

(72) Inventors: Sung Min Sohn, Minneapolis, MN (US); Djaudat S. Idiytullin, Minneapolis, MN (US); J. Thomas Vaughan, Minneapolis, MN (US); Michael Garwood, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 187 days.

(21) Appl. No.: 15/872,068

(22) Filed: Jan. 16, 2018

(65) Prior Publication Data
US 2018/0203083 A1    Jul. 19, 2018

Related U.S. Application Data

(60) Provisional application No. 62/447,179, filed on Jan. 17, 2017.

(51) Int. Cl.
  *G01R 33/54* (2006.01)
  *G01R 33/36* (2006.01)
  *G01R 33/565* (2006.01)

(52) U.S. Cl.
  CPC ....... *G01R 33/543* (2013.01); *G01R 33/3607* (2013.01); *G01R 33/3621* (2013.01);
(Continued)

(58) Field of Classification Search
  CPC .............. G01R 33/543; G01R 33/3607; G01R 33/3621; G01R 33/56509; G01R 33/3678; G01R 33/3657
(Continued)

(56) References Cited

U.S. PATENT DOCUMENTS

| 7,336,074 B2 * | 2/2008 | Yang .................. G01R 33/3415 324/309 |
| 7,642,782 B2 * | 1/2010 | Vernickel ............. G01R 33/365 324/318 |

(Continued)

OTHER PUBLICATIONS

Özen, A.Ç., 2013. A method of decoupling of radio frequency coils in magnetic resonance imaging: application to MRI with ultra short echo time concurrent excitation and acquisition (Doctoral dissertation, bilkent university). (Year: 2013).*

(Continued)

*Primary Examiner* — Christopher P McAndrew
(74) *Attorney, Agent, or Firm* — Quarles & Brady LLP (57) ABSTRACT

Systems and methods for simultaneous radio frequency ("RF") transmission and reception for nuclear magnetic resonance applications, such as magnetic resonance imaging ("MRI") are described. The system includes a simultaneous transmit and receive ("STAR") control system that compensates for the effects of load changes in a radio frequency ("RF") coil due to the inevitable motion of living subjects (e.g., from subject motion, respiration, swallowing). The system also maintains a high transmit-receive isolation, even when scanning a subject using a continuous RF broad band sweep excitation.

20 Claims, 8 Drawing Sheets

(52) U.S. Cl.
CPC ...... *G01R 33/3657* (2013.01); *G01R 33/3678* (2013.01); *G01R 33/56509* (2013.01)
(58) Field of Classification Search
USPC .......................................................... 324/309
See application file for complete search history.

(56) References Cited

U.S. PATENT DOCUMENTS

| | | | |
|---|---|---|---|
| 9,625,551 B2* | 4/2017 | Ozen | G01R 33/543 |
| 2009/0302841 A1* | 12/2009 | Avdievich | G01R 33/3415 |
| | | | 324/309 |
| 2012/0223709 A1* | 9/2012 | Schillak | G01R 33/3607 |
| | | | 324/309 |

OTHER PUBLICATIONS

Anderson WA. Applications of Modulation Techniques to High Resolution Nuclear Magnetic Resonance Spectrometers. Review of Scientific Instruments. 1962;33(11):1160-6. doi: doi:http://dx.doi.org/10.1063/1.1717720.
Beasley PDL, Stove A, Reits BJ, As B, editors. Solving the problems of a single antenna frequency modulated CW radar. Radar Conference, 1990, Record of the IEEE 1990 International; 1990 May 7-10, 1990.
Bharadia D, EM, and Sachin Katti. Full Duplex Radios. ACM SIGCOMM; Hong Kong2013. p. 375-86.
Bloch F, Hansen WW, Packard M. The Nuclear Induction Experiment. Physical Review. 1946;70(7-8):474-85.
Brunner DO, Pavan M, Dietrich B, Rothmund D, Heller A, Pruessmann KP. Sideband Excitation for Concurrent RF Transmission and Reception. ISMRM. 2011;19:625.
Brunner DO, E. B, Dietrich, Pavan M, Pruessmann KP, editors. MRI with Sideband Excitation: Application to Continuous SWIFT. Proceedings of the 19st Annual Meeting of ISMRM; 2012; Montreal, Canada.
Choi YS, Shirani-Mehr H., Simultaneous Transmission and Reception: Algorithm, Design and System Level Performance. Wireless Communications, IEEE Transactions on. 2013;12(12):5992-6010. doi: 10.1109/TWC.2013.101713.121152.
Davies GR, Lurie DJ, Hutchison JMS, McCallum SJ, Nicholson I. Continuous-Wave Magnetic Resonance Imaging of Short T2 Materials. Journal of Magnetic Resonance. 2001;148(2):289-97. doi: http://dx.doi.org/10.1006/jmre.2000.2245.
Dinc T, Chakrabarti A, Krishnaswamy H. A 60 GHz CMOS Full-Duplex Transceiver and Link with Polarization-Based Antenna and RF Cancellation. IEEE Journal of Solid-State Circuits. 2016;PP(99):1-16. doi: 10.1109/JSSC.2015.2507367.
Idiyatullin D, Corum C, Park J-Y, Garwood M. Fast and quiet MRI using a swept radiofrequency. Journal of Magnetic Resonance. 2006;181(2):342-9. doi: http://dx.doi.org/10.1016/j.jmr.2006.05.014.

Idiyatullin D, et al., in "Continuous SWIFT," J Magn Reson., 2012; 220(0):26-31.
Kolodziej KE, McMichael JG, Perry BT, editors. Adaptive RF canceller for transmit-receive isolation improvement. Radio and Wireless Symposium (RWS), 2014 IEEE; 2014 Jan. 19-23, 2014.
Lauterbur PC. Image Formation by Induced Local Interactions: Examples Employing Nuclear Magnetic Resonance. Nature. 1973;242(5394):190-1.
Marjanska M, Waks M, Snyder CJ, Vaughan JT. Multinuclear NMR investigation of probe construction materials at 9.4T. Magnetic Resonance in Medicine. 2008;59(4):936-8. doi: 10.1002/mrm.21566.
O'Sullivan T, York RA, Noren B, Asbeck PM. Adaptive duplexer implemented using single-path and multipath feedforward techniques with BST phase shifters. Microwave Theory and Techniques, IEEE Transactions on. 2005;53(1):106-14. doi: 10.1109/TMTT.2004.839900.
Özen A.C., et al., in "Active Decoupling of RF Coils: Application to 3D MRI with Concurrent Excitation and Acquisition," Proc. 23rd scientific meeting, ISMRM, Toronto, Canada, p. 750 (2015).
Özen A, Bock M, Atalar E. Active decoupling of RF coils using a transmit array system. Magn Reson Mater Phy. 2015:1-12. doi: 10.1007/s10334-015-0497-0.
Sohn SM, Gopinath A, Vaughan JT, editors. Tunable and high directivity coupler for MRI applications. Microwave Symposium (IMS), 2014 IEEE MTT-S International; 2014 Jun. 1-6, 2014.
Sohn SM, DelaBarre L, Gopinath A, Vaughan JT. Design of an Electrically Automated RF Transceiver Head Coil in MRI. IEEE Transactions on Biomedical Circuits and Systems. 2015;9(5):725-32. doi: 10.1109/TBCAS.2014.2360383.
Sohn et al. "In Vivo MR Imaging with Simultaneous RF Transmission and Reception" Magnetic Resonance in Medicine 76:1932-1938 (2016), pp. 1932-1938.
Sohn et al. "Automatic RF leakage signal canceler in MRI applications" 978-1-5090-6360-4/17/, 2017 IEEE, pp. 1394-1395.
Stove AG. Linear FMCW radar techniques. IEE Proceedings F—Radar and Signal Processing. 1992;139(5):343-50. doi: 10.1049/ip-f-2.1992.0048.
Vaughan JT, Garwood M, Collins CM, Liu W, DelaBarre L, Adriany G, Andersen P, Merkle H, Goebel R, Smith MB, Ugurbil K. 7T vs. 4T: RF power, homogeneity, and signal-to-noise comparison in head images. Magnetic Resonance in Medicine. 2001,46(1):24-30. doi: 10.1002/mrm.1156.
Vaughan JT, Gregor Adriany, Michael Garwood, Peter Andersen, Kamil Ugurbil. The Head Cradle: An Open Faced, High Performance TEM Coil. ISMRM. 2001.
Wang J, Mao W, Qiu M, Smith MB, Constable RT. Factors influencing flip angle mapping in MRI: RF pulse shape, slice-select gradients, off-resonance excitation, and B0 inhomogeneities. Magnetic Resonance in Medicine. 2006;56(2):463-8. doi: 10.1002/mrm.20947.
Weiger M, Brunner DO, Dietrich BE, Müller CF, Pruessmann KP. ZTE imaging in humans. Magnetic Resonance in Medicine. 2013;70(2):328-32. doi: 10.1002/mrm.24816.

* cited by examiner

Frequency swept pulse

SYSTEM AND METHOD FOR SIMULTANEOUS RADIO FREQUENCY TRANSMISSION AND RECEPTION IN MAGNETIC RESONANCE IMAGING

CROSS-REFERENCE TO RELATED APPLICATIONS

This application is based on, claims priority to, and incorporates herein by reference in its entirety, U.S. Provisional Application Ser. No. 62/447,179, filed Jan. 17, 2017.

STATEMENT REGARDING FEDERALLY SPONSORED RESEARCH

This invention was made with government support under MH105998, EB006835, EB020058, EB015894, awarded by National Institutes of Health. The government has certain rights in the invention.

BACKGROUND

The NMR experiment is based on observing the spin system response invoked by a radiofrequency ("RF") pulse. The large difference between levels of transmit ("Tx") and receive ("Rx") NMR signals requires a high isolation between Tx and Rx channels. In modern NMR scanners, isolation is usually achieved by separating these processes in time (i.e., by performing acquisition after pulsed excitation) or more rarely in frequency (i.e., by using different frequencies for Tx or Rx). In early NMR experiments, an alternative approach was used whereby Tx and Rx were performed simultaneously at the same frequency. This method can be generally referred to as simultaneous transmit and receive ("STAR").

The STAR approach can have a number of advantages for MRI. As one advantage, the distribution of RF power in time results in a decrease of the RF peak-power requirement to just a few percents of the RF peak power required in a conventional pulsed Fourier transformation ("FT") mode. As another advantage, the absence of a delay between spin excitation and acquisition allows signal detection from most spins, including those with ultra-short spin-spin relaxation times (T2 and T2*). As still another advantage, the excitation in STAR can be done efficiently in the frequency bandwidth of interest without wasting energy outside of this bandwidth, unlike broadband pulsed excitation or gapped excitation, which create unused sidebands. This tailored excitation can considerably decrease the specific absorption rate ("SAR"), which is a limiting factor for high field magnetic resonance imaging ("MRI"), or in the imaging of low gamma nuclei (i.e., nuclei with a small gyromagnetic ratio).

Due to mutual coupling between the Tx and Rx ports in an RF coil, some of the transmit RF signal leaks into the receiver. Without optimal Tx-Rx isolation, the leakage signal level exceeds the RF input power maximum of the first, low noise pre-amplifier ("LNA") at the receiver. In this case, it is difficult to extract the desired NMR signal from the received signal. Therefore, in a STAR system, the mutually coupled leakage signal must be cancelled out or at least decreased to below the threshold of the first LNA by using additional passive devices, active devices, or both.

Recently, a few published works have demonstrated a "proof-of-principle" for the STAR approach in the field of MRI. In one example described by D. Idiyatullin, et al., in "Continuous SWIFT," *J Magn Reson.*, 2012; 220(0):26-31, Tx-Rx isolation was increased to a level compatible with successful imaging by using a standard quadrature hybrid with a quadrature driven coil and a slightly detuned resonance condition for internal compensation of the leakage signal with reflected power. In another example described by A. C. Ozen, et al., in "Active Decoupling of RF Coils: Application to 3D MRI with Concurrent Excitation and Acquisition," *Proc. 23rd scientific meeting, ISMRM*, Toronto, Canada, p. 750 (2015), an additional transmit coil was used to decouple Tx and Rx ports.

While high isolation can be achieved between transmit and receive in a quadrature driven coil, slight load changes within the coil, such as those that occur with subject movement, can quickly and significantly degrade the tune, match, and STAR isolation in the coil. Unfortunately, both of the methods mentioned above are highly sensitive to the RF coil's loading conditions, which make their use impractical for in vivo MRI.

Because Tx-Rx isolation achieved by geometrically decoupled transmit from receive fields in an RF coil is not stable enough to accommodate variable in vivo load conditions, a STAR system with a load-insensitive design must be added between the coil and a receiver chain. Thus, there remains a need for an RF system capable of implementing simultaneous transmit and receive under variable loading conditions.

SUMMARY

It is one aspect of the present disclosure to provide a control system for simultaneous radio frequency ("RF") transmission and reception in nuclear magnetic resonance applications. The control system generally includes a control device, an RF combiner, a transmit port, and a receive port. The control device generates a canceling signal indicative of variations in a load condition of an RF coil in electrical communication with the control device. The transmit port is in electrical communication with the RF coil and communicates an RF transmit signal to the RF coil. The receive port receives nuclear magnetic resonance signals from the RF coil that is also in electrical communication with the transmit port. The RF combiner is in electrical communication with the receive port and the control device. The RF combiner combines the signals from the receive port of the coil with the cancelling signal generated by the control device to reduce signal components in the nuclear magnetic resonance signals attributable to mutually coupled transmit signal leakage in the receive port from the transmit port.

It is another aspect of the present disclosure to provide a method for producing an image with a magnetic resonance imaging ("MRI") system while simultaneously transmitting and receiving RF signals. A control device generates a cancelling signal indicative of variations in a load condition of an RF coil in electrical communication with the control device. An RF excitation field is transmitted to an object with an RF coil using the RF transmit signal, and in response thereto nuclear magnetic resonance signals are received from the object using the RF coil while the RF excitation is being transmitted. The output signals from the RF coil are combined with the cancelling signal to generate compensated nuclear magnetic resonance signals, in which signal components in the nuclear magnetic resonance signals attributable to mutually coupled transmit signal leakage in a receive port of the RF coil from a transmit port of the RF coil are minimized. An image of the object is then produced from the compensated nuclear magnetic resonance signals. In one version, the method further comprises separating the residual leakage signal and the nuclear magnetic resonance signals using a signal processor with a digital cancelling algorithm.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Described here is a system for simultaneous radio frequency ("RF") transmission and reception for nuclear magnetic resonance applications, such as magnetic resonance imaging ("MRI"). The system includes a simultaneous transmit and receive ("STAR") control system that compensates for the effects of load changes due to the inevitable motion of living subjects (e.g., from subject motion, respiration, swallowing). The system also maintains a high transmit-receive isolation, even when scanning a subject using a continuous RF sweep excitation with the use of a conventional MRI scanner.

The system described here provides a load-insensitive design using a feedback system to compensate for load shifts (e.g., by subject motion, respiration, swallowing) during MRI scanning. This load-insensitivity can be achieved using a feedforward and feedback circuit to cancel out leakage signals and compensate for variations in the RF coil load. As a result, the systems described here can be used to acquire magnetic resonance images, in vivo, despite subject motion.

The system described here also provides for very low RF peak power using a continuous wave ("CW") mode, which transmits and receives RF signal at the same time. In CW mode, RF power can be distributed in time compared to a pulsed mode. The system and methods described herein provide the imaging possibility for the fast decaying spin system because there is no delay (i.e., there is a 100 percent duty cycle) or waiting time between RF transmission and reception. As such, the system described here can measure magnetic resonance signals regardless of decaying time.

It is contemplated that the STAR control system described in the present disclosure can provide an increase in signal-to-noise ratio ("SNR") relative to separate transmission and reception because of the ability to utilize continuous signal acquisition.

A system that allows for simultaneous RF excitation and signal acquisition can provide advantages to MRI applications, including the ability to reduce RF peak power requirements and to image fast relaxing spins. Preferably, this capability would provide an optimal usage of RF transmitter peak power (e.g., lowest peak power and low SAR) and optimal signal sampling (e.g., high SNR). However, the practical realization of such a system is technically challenging due to a large RF power difference between transmit and receive channels working at the same frequency, which requires a high isolation between the transmit and receive channels.

The system described in the present disclosure can use a sampled and manipulated transmit signal to compensate the leakage in receive signal. A control device, such as an RF power sampler, can be used to extract a cancellation signal that is proportional to a coupled transmit signal. Thus, variations in loading conditions affecting the coupled transmit signal can be reflected also in the cancellation signal and, therefore, the system will minimize the effects from the coil loading variations. The gain and phase of the sampled transmit signal can be optimized in a coil-independent passive and active module to maximize the transmit-receive isolation without degradation of the RF coil's quality.

Figure 1:
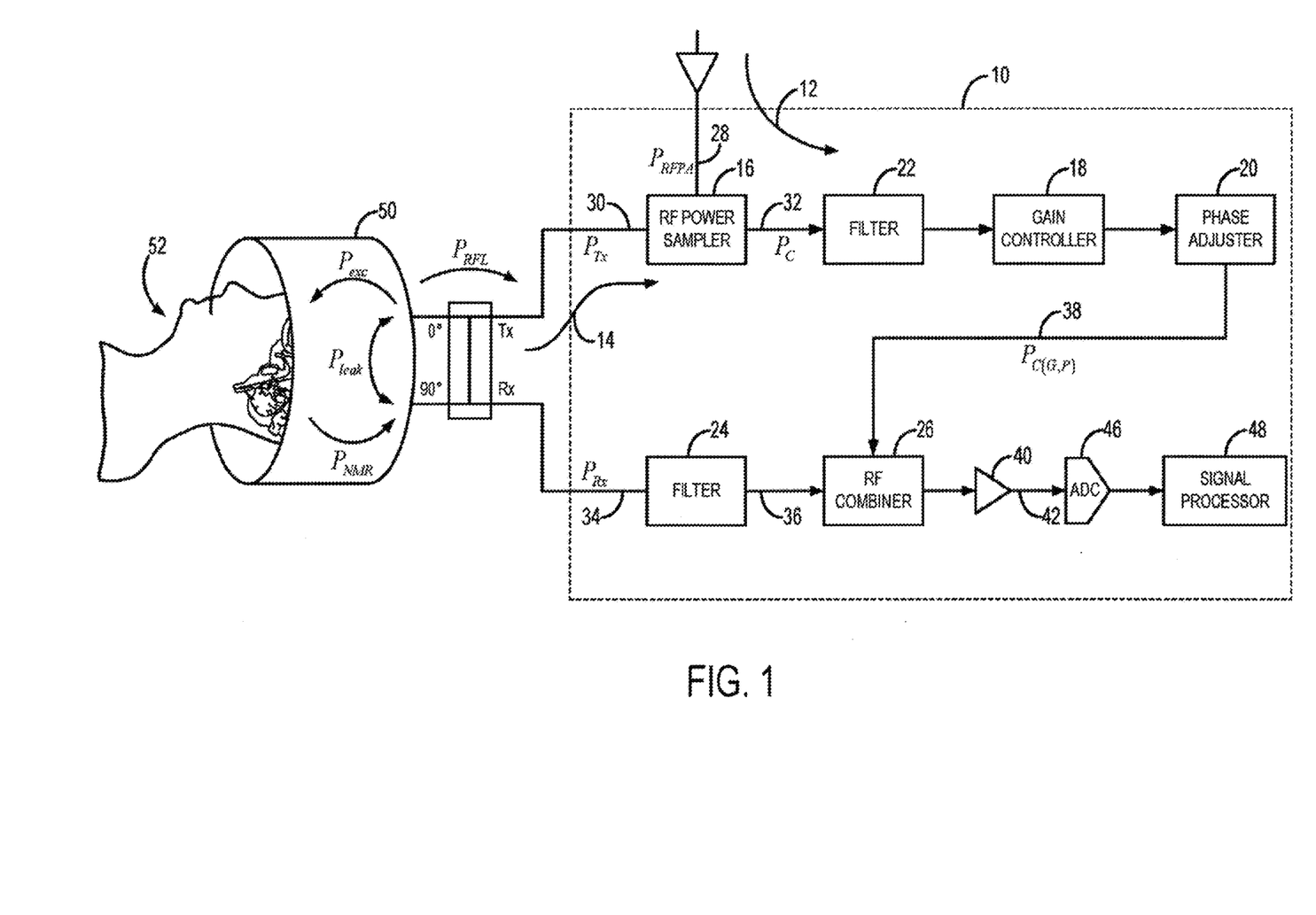
FIG. 1 is an example of a control system for simultaneous transmission and reception ("STAR") in nuclear magnetic resonance applications.

FIG. 1 illustrates an example STAR control system 10. The STAR control system 10 generally includes a feedforward path 12 to generate a cancelling signal and a feedback path 14 to compensate for load variations in an RF coil 50 in electrical communication with the STAR control system 10. The feedforward path 12 may also be referred to as the cancelling signal path, and the feedback path 14 may also be referred to as the sampled RF signal path. In general, the load variations are caused by motion of the subject 52 being imaged by the RF coil; however, other load variations in the RF coil 50 can also be compensated for by the STAR control system 10.

The STAR control system 10 includes an RF power sampler 16; a gain controller 18; a phase adjuster 20; a first signal filter 22; a second signal filter 24; and an RF combiner 26. The RF power sampler 16 generally includes a coupled-line coupler with lumped components. For instance, the RF power sampler 16 can implement a coupler with high directivity, and some passive components, to adjust the proportionality to the reflected signal. The RF power sampler 16 can be optimized for a particular RF coil design (e.g., TEM, birdcage, loop). The RF sampler 16 generally defines a passive compensation module.

The gain controller 18 can include an attenuator, such as the RVA-3000 attenuator manufactured by Mini-circuit (New York, N.Y.); however, other suitable gain controllers known to those skilled in the art can also be used. The phase adjuster 20 can be the SPHSA-251 phase adjuster manufactured by Mini-circuit (New York, N.Y.); however, other suitable phase adjusters known to those skilled in the art can also be used. The gain controller 18 and phase adjuster 20 can be adjusted manually, or via a remote control system. The RF combiner 26 preferably implements a symmetrical Wilkinson power combiner design; however, other power combiner designs can also be implemented. The output of the RF combiner is amplified by a low-noise amplifier ("LNA") 40, such as the ZX60-P103LN LNA manufactured by Mini-circuit (New York, N.Y.); however, other suitable LNAs known to those skilled in the art can also be used.

Figure 2:
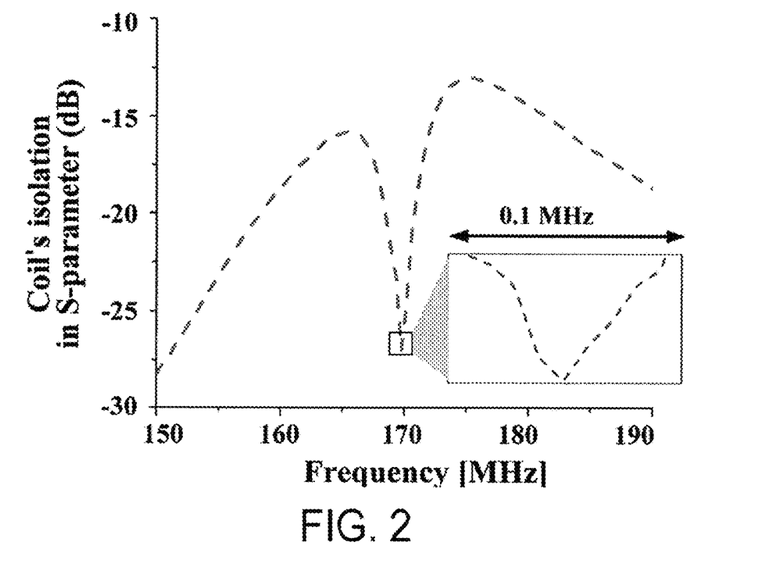
FIG. 2 shows an isolation profile of an RF coil with a quadrature driving optimization.

The quality of the cancelled leakage signal within a frequency sweep range depends on the similarity of frequency responses of the RF signal path and the cancelling signal path. FIG. 2 shows an isolation profile of the RF coil with a quadrature driving optimization. The frequency response of the RF coil has a "V" shape within the frequency sweep range in logarithmic scale. The similarity of the frequency response of the canceling path can be reached by implementing symmetrizing band-pass filters 22, 24 in the canceling path and the RF signal path.

The transmitter output, $P_{RFPA}$, on line 28 is divided at the RF power sampler 16 into a transmit RF pulse signal, $P_{Tx}$, on line 30 and a cancelling signal, $P_C$, on line 32. The cancelling signal, $P_C$, created by the RF power sampler 16 includes a coupled forward signal, $\alpha P_{RFPA}$, and a coupled reflected signal, $\beta P_{RFL}$. The circuit in the RF power sampler 16 separates and controls the coupling factors, $\alpha$ and $\beta$. For instance, the RF power sampler 16 can set the coupling factors, $\alpha$ and $\beta$, such that $\beta P_{RFL}$ is larger than $\alpha P_{RFPA}$, in general.

When ignoring minor loss terms, the transmit signal, $P_{Tx}$, includes the exciting RF signal, $P_{exc}$, the leakage signal, $P_{leak}$, from the transmit port (Tx) to the receive port (Rx), and the reflected signal, $P_{RFL}$, depending on load conditions, $$P_{Tx}=P_{exc}+P_{leak}+P_{RFL}$$

The received signal, $P_{Rx}$, on line 34 includes the NMR signal, $P_{NMR}$, from a subject 52 and the leakage signal, $P_{leak}$, from the transmit port, $$P_{Rx}=P_{NMR}+P_{leak}$$

This received signal, $P_{Rx}$, is then filtered by the signal filter 24 before being communicated to the RF combiner 26 on line 36.

As mentioned above, the cancelling signal on line 32, $P_C$, is a function of $P_{RFPA}$ and $P_{RFL}$ according to the coupling factors, $\alpha$ and $\beta$, respectively, of the coupler in the RF power sampler 16, $$P_C=\alpha P_{RFPA}+\beta P_{RFL}$$

This cancelling signal, $P_C$, is then filtered by the signal filter 24, its gain is adjusted by the gain controller 18, and its phase is adjusted by the phase adjuster 20. The filtered, gain adjusted, and phase adjusted cancelling signal, $P_{C(G,P)}$, on line 38 is then combined at the RF combiner 26 with the filtered P signal from line 36. When the filtered and adjusted cancelling signal, $P_{C(G,P)}$, is close to the leakage signal, $P_{leak}$, with a 180 degree phase shift, the residual leakage component, $P_{Residue}$, is minimized to be within the dynamic range of a low-noise amplifier ("LNA") 40.

The amplified signal on line 42 is then converted to a digital signal by an analog-to-digital converter ("ADC") 46. After the ADC 46, the residual leakage component, $P_{Residue}$, is removed by a digital cancelling algorithm in a signal processor 48. As one example, the residual leakage component, $P_{Residue}$, can be removed by the digital cancelling algorithm described by D. Idiyatullin, et al., in "Continuous SWIFT," *J Magn Reson.*, 2012; 220(0):26-31.

The mutually coupled leakage signals $P_{leak}$ and $P_{RFL}$ correlate directly to the loading conditions presented by a subject 52 in the RF coil 50. A load change in the RF coil 50 results in an increased $P_{leak}$ on line 36, and the coupled $\beta P_{RFL}$ signal is also increased by the degree of the load variation in the feedback loop. Thus, the feedforward path 12 from line 28 through to line 38 mirrors the effect of load variation in the RF signal path (e.g., feedback path 14) from line 28 to line 36.

Figure 3:
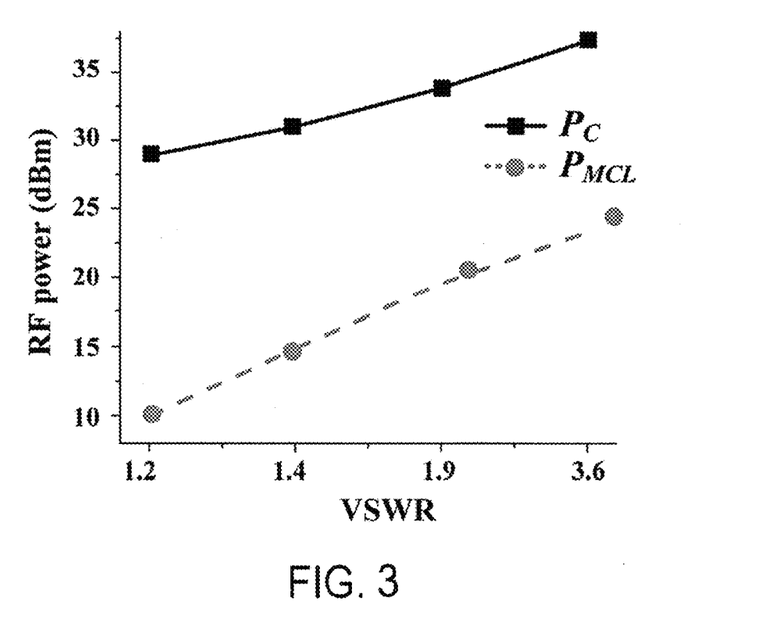
FIG. 3 shows the linear relationship between the power levels of a cancelling signal generated by the STAR control system of FIG. 1 and the mutually coupled leakage signal between transmit and receive ports with respect to the load variation in an RF coil.

FIG. 3 shows the linear relation between the power levels of $P_C$ and $P_{leak}$ with respect to the load variation represented by the voltage standing wave ratio ("VSWR") on line 28. For the calculation of RF power levels in this example, the tuned and matched condition of the RF coil 50 was assumed to have a VSWR equal to 1.2 on line 28 and an isolation (in the feedback path 14) of 30 dB. Other parameters for this example includes an input power of 40 dBm, a forward coupling factor, $\alpha$, of 30 dB, and a reflected coupling factor, $\beta$, of 10 dB. The plotted $P_C$ values are based on the average minimum and maximum RF power levels generated by the standing wave ratio, which depends on the directivity of a coupler. To maintain similar slopes of $P_{leak}$ and $P_C$ with load variation, the characteristics of the RF coil 50 and lumped-element circuits in the RF power sampler 16 can be adjusted. The gain controller 18 compensates for the difference in power level between $P_{leak}$ and $\beta P_{RFL}$.

As one example, the RF coil 50 can be a quadrature driven RF coil, such as an open-faced TEM coil design; however, it will be appreciated that other suitable RF coil designs can also be used. In a specific, non-limiting example, the RF coil can include a number of inductively coupled elements driven by two 90 degree phased ports for quadrature or circularly polarized excitation and reception. Variable capacitors in series with the driven elements can be used to adjust match impedance between the loaded coil and the quadrature hybrid. These capacitors can also be used to trim the isolation between the drive ports.

The transmit and receive fields in a quadrature driven coil are inherently geometrically decoupled. A quadrature hybrid interfacing the RF coil to the MRI system power amplifier and receiver also provides separation and, therefore, isolation between the transmit signal to the coil and the receive signal from the coil. A properly tuned, matched and transmit-receive isolated coil can achieve high transmit-receive isolation that may be greater than 40 dB, which is sufficient for STAR-based imaging, but only for a static (i.e., inanimate) load. The isolation provided by such a coil plus hybrid alone is, however, generally unstable with a non-stationary (e.g., living) load for successful MRI. For this reason, the STAR circuitry described in the present disclosure has the added advantage of achieving the stable, load insensitive isolation levels beneficial for in vivo MRI. The isolation achieved between transmit and receive signals when using the STAR control systems and methods of the present disclosure may be above at least one of 30, 35, 38, 39, 40, 41, 42, 43, 44, 45, or 50 dB.

To minimize noise generated by the STAR system, the feedforward path 12 can be constructed using only passive devices and no active devices. In such configurations, the main potential noise source will generally be the transmitter's RF power amplifier. This noise can be decreased by using a separate, low noise figure, power amplifier. Noise generated by other electronic components, such as diodes and resistors, in the STAR system may also degrade the SNR during MRI experiments.

Figure 4:
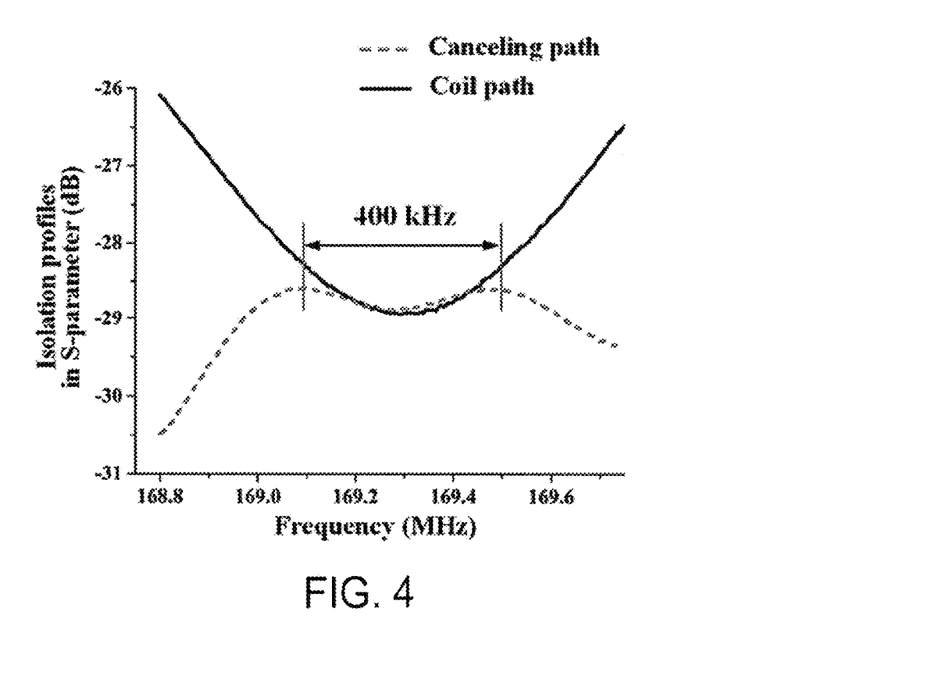
FIG. 4 shows a plot of frequency responses of an RF coil's isolation in the cancelling path and the RF coil path of the STAR control system of FIG. 1.
Figure 5:
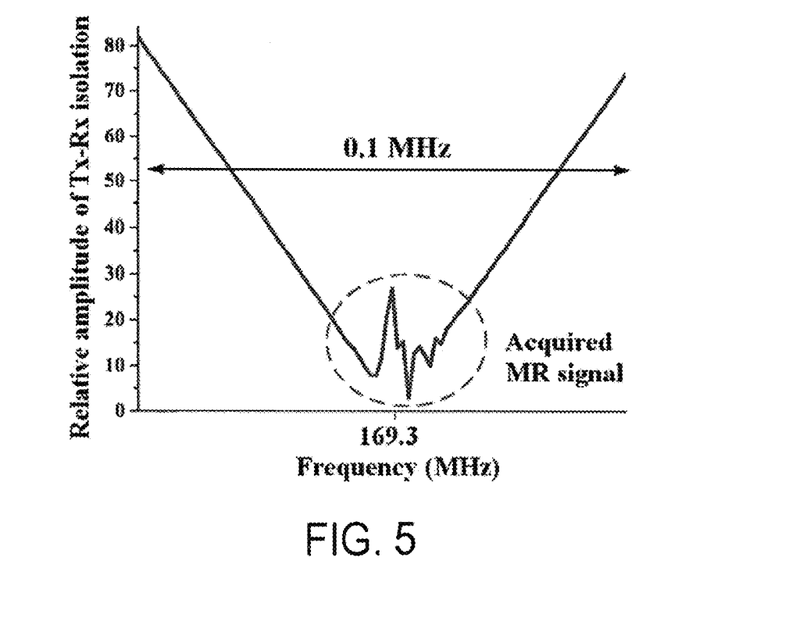
FIG. 5 shows a measured amplitude of signal received using the STAR control system of FIG. 1 and a continuous SWIFT acquisition.

The quality of acquired images will be influenced by the stability of a high isolation point between transmit and receive signals, as affected by the STAR system. Frequency response of the RF coil's isolation and the cancelling path can be roughly similar after fine adjustment, as shown in FIG. 4. However, the resulting frequency response of the transmit-receive isolation, such as in the example shown in FIG. 5, after fine tuning and adjusting by maximizing the magnetic resonance signal may not appear flat. At the highly isolated level, a small asymmetric DC bias in the RF combiner can increase the offset of the residual leakage signal. The accuracy and linearity of the sampled signal, $P_{C(G,P)}$, may deviate due to the standing wave generated by the composite of the forward and reverse signals. A real-time automatic tuning, matching, and isolation system is another implementation that could be incorporated to further improve high isolation stability and control.

The STAR system of the present disclosure can provide a wide dynamic range independent of the level of the RF coil's transmit-receive isolation. A strongly coupled RF coil (e.g., approximately 3 dB to 10 dB isolation) between the transmit and receive functions will have similar loading effects in both and, therefore, will have decreased sensitivity to loading variations. In these cases, the STAR system of the present disclosure can use an amplification of the coupled signal to cancel out a large leakage signal, whereas a weakly coupled coil (e.g., about 30 dB isolation) can use only low power in the STAR system. A weakly coupled system, however, has a higher loading sensitivity and may use a higher coupling factor resulting in increased instability of the system. Therefore, the gain control unit, the RF coil's transmit-receive isolation, and the coupling factors in the RF power sampler should be well defined to achieve the desired isolation with realizable circuit parameters.

The use of ultra-low RF peak power (e.g., less than 1 W) makes it possible for the RF front-end of the STAR system to be very compact, efficient, and economical. Additionally, the SAR, which is proportional to the square of $B_0$, can become a safety risk at ultra-high fields (e.g., 7 T and beyond). This problem could be reduced using a STAR system combined with a tailored frequency-swept excitation.

Figure 6B:
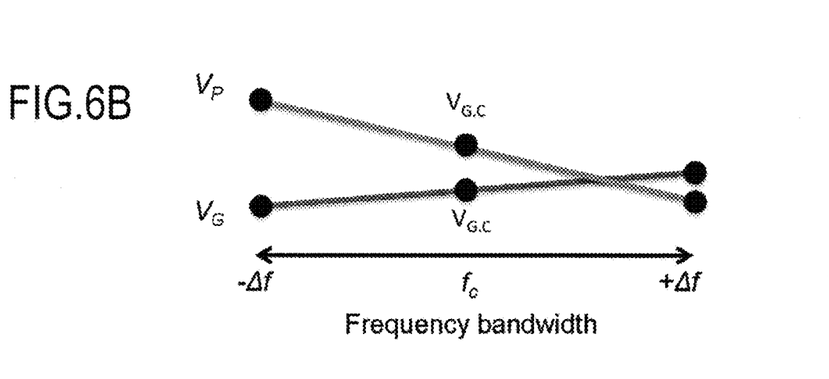
FIG. 6B shows the linear adjustment of gain and phase control signals across a frequency bandwidth.
Figure 7A:
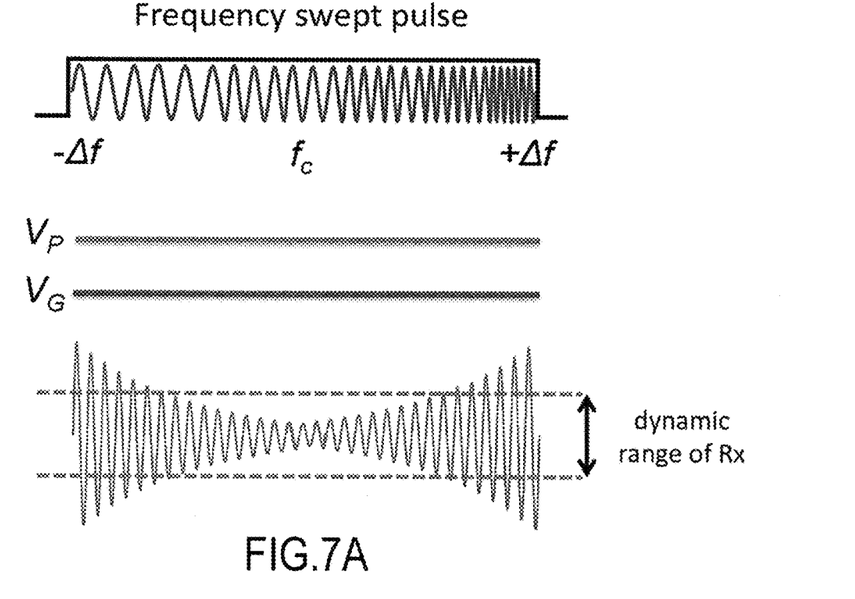
FIG. 7A shows the leakage signal at Rx across a frequency bandwidth when the gain and phase control signals are held constant for a STAR control system with continuous SWIFT acquisition.
Figure 7B:
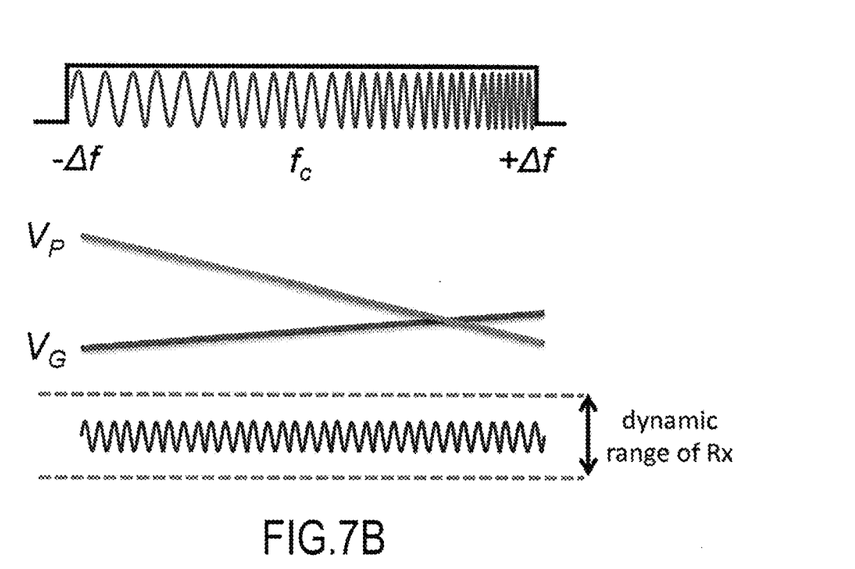
FIG. 7B shows the leakage signal at Rx across a frequency bandwidth when the gain and phase control signals are linearly adjusted using the procedure presented in FIG. 6A for a STAR control system with continuous SWIFT acquisition.

The systems and methods of the present disclosure may include a frequency sweep compensation (FSC) technique. In the FSC technique, the STAR control system can adaptively change the gain and phase control signals by using a sweep of the control signals. As can be seen in FIG. 6B and FIG. 7B, this adaptive control is based on the gain voltage ($V_G$) and the phase voltage ($V_P$). The FSC technique can occur across the frequency bandwidth and can be used during each frequency swept pulse. In frequency swept RF pulse techniques, a higher bandwidth is generally better for MR imaging and the level of leakage signals can be over the dynamic range of the receive chain when we increase the bandwidth, as can be seen in FIG. 7A.

Preferably, the FSC technique can be implemented with a real-time, automatic gain and phase control system. Automatic systems with fixed gain and phase control signals, such as those present in FIG. 7A, as well as manually control systems, have limitations on the effective frequency bandwidth that can be used. However, this technique may also be implemented manually by an operator. In the FSC technique, each frequency component has different gain and phase control signals to minimize the leakage signal at each specific frequency.

Figure 6A:
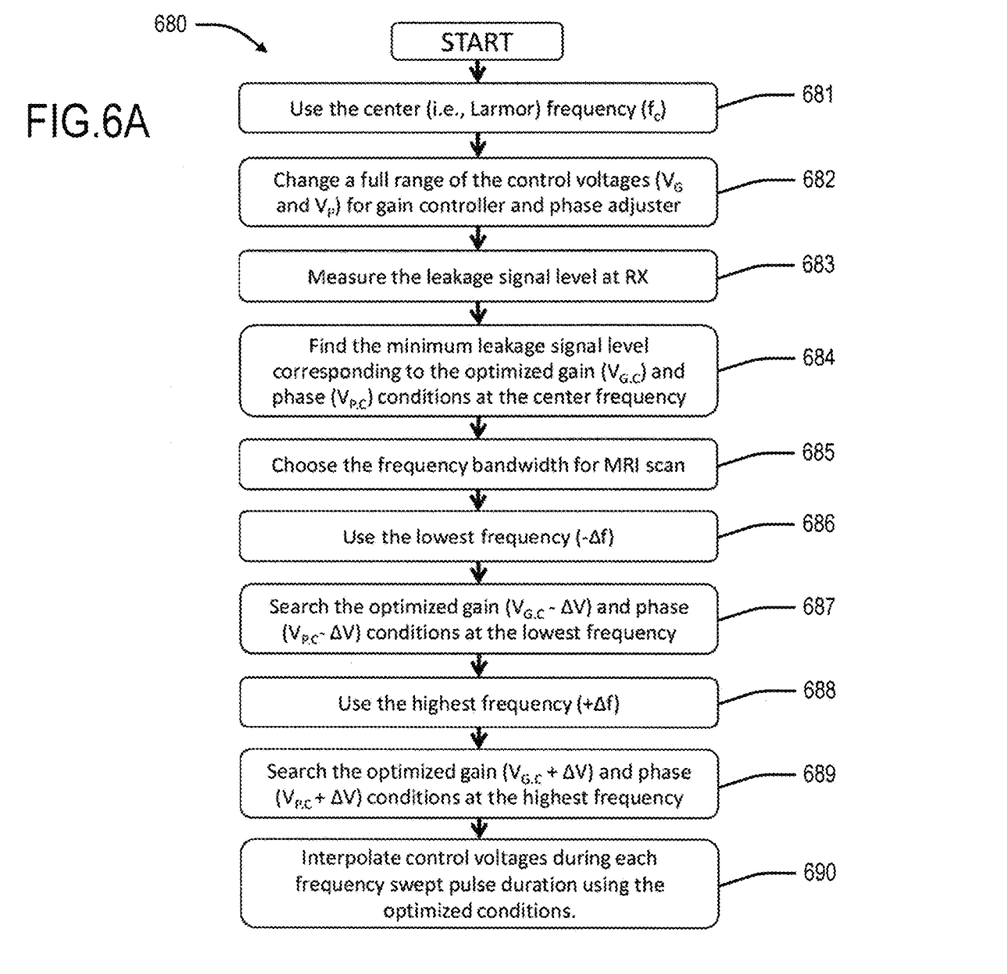
FIG. 6A shows a process flow diagram of a procedure for a adjusting gain and phase control signals for the canceling signal of a STAR control system with continuous SWIFT acquisition.

FIG. 6A shows a process flow diagram 680 for the FSC procedure detailing how the gain and phase control signals are calculated for each frequency component. The procedure includes the step of using the center (i.e., Larmor) frequency ($f_c$) in process block 681. The step of changing a full range of the control voltages ($V_G$ and $V_P$) for the gain controller and phase adjuster occurs in process block 682. The step of measuring the leakage signal level at the Rx signal occurs in process block 683. The step of finding the minimum leakage signal level corresponding to the optimized gain ($V_{G,C}$) and phase ($V_{P,C}$) conditions at the center frequency occurs in process block 684. The step of choosing the frequency bandwidth for MRI scan occurs in process block 685. The step of using the lowest frequency ($-\Delta f$) occurs in process block 686. The step of searching for the optimized gain ($V_{G,C}-\Delta V$) and phase ($V_{P,C}-\Delta V$) conditions at the lowest frequency occurs in process block 687. The step of using the highest frequency ($+\Delta f$) occurs in process block 688. The step of searching for the optimized gain ($V_{G,C}+\Delta V$) and phase ($V_{P,C}+\Delta V$) conditions at the highest frequency occurs in process block 689. The step of interpolating control voltages during each frequency swept pulse duration using the optimized conditions occurs in process block 690.

When using the FSC technique, depending on whether the leakage signal is lag or lead compared to the Rx signal, the gain and phase control voltage sweep (linear changing) can be swapped. There are four possibilities for the linear control voltage trends of $V_G$ and $V_P$ across the bandwidth: both may be increasing, both may be decreasing, $V_G$ decreasing with $V_P$ increasing, or $V_G$ increasing with $V_P$ decreasing, the last of which is specifically presented in FIG. 7B. The lead or lag condition can be changed according to different set up conditions. This property can be unpredictable due to different surrounding conditions that can change the phase or amplitude of RF signals. To account for these variations, the gain and phase sweeping option can be set among the four possible cases using automatic or manual control through wired or wireless communication.

Figure 8A:
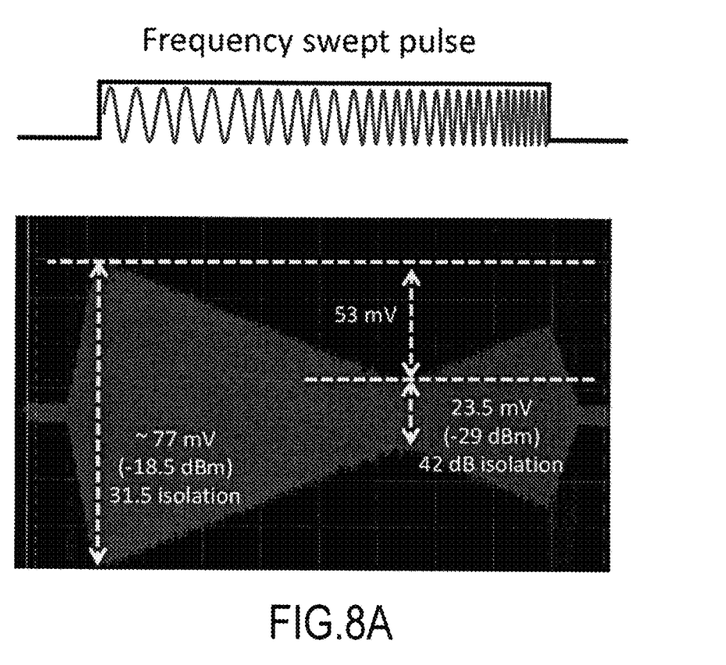
FIG. 8A shows experimentally measured leakage signals across a frequency bandwidth when the gain and phase control signals are held constant for a STAR control system with continuous SWIFT acquisition.
Figure 8B:
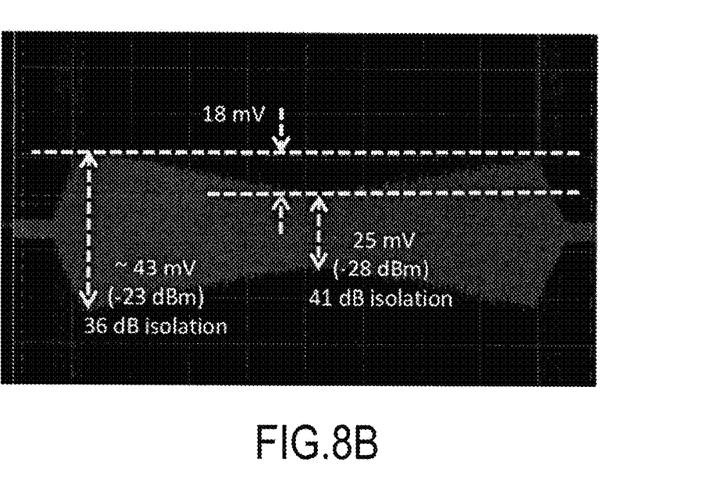
FIG. 8B shows experimentally measured leakage signals across a frequency bandwidth when the gain and phase control signals are linearly adjusted using the procedure presented in FIG. 6A for a STAR control system with continuous SWIFT acquisition.

FIG. 8 shows experimentally measured leakage signals obtained without FSC (8A) and with FSC (8B). As shown in these results, the FSC technique generally raises the isolation values across the frequency bandwidth, resulting in a higher frequency bandwidth.

Figure 9:
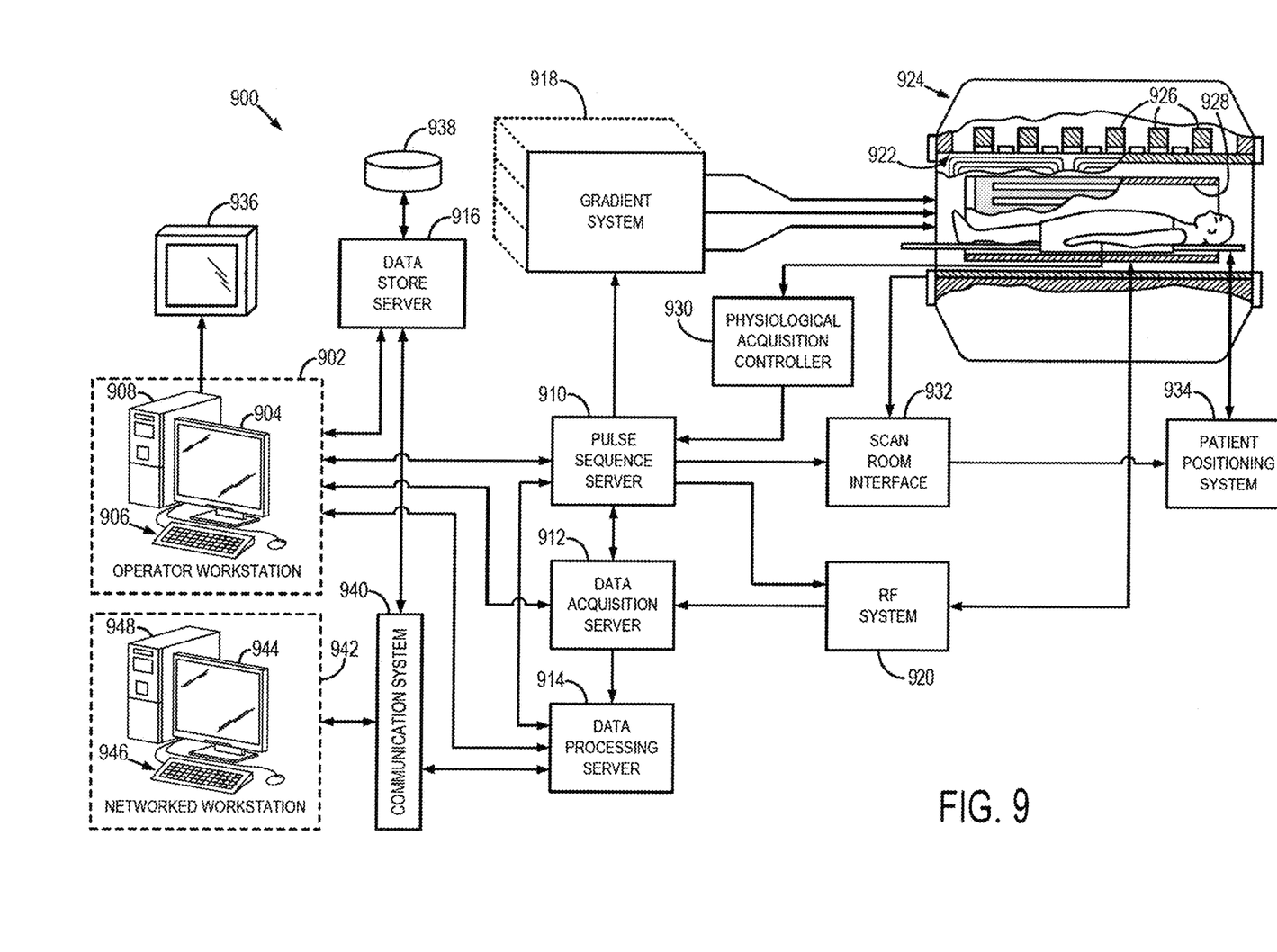
FIG. 9 is a block diagram of an example magnetic resonance imaging ("MRI") system that can implement the STAR control system described in the present disclosure.

Referring particularly now to FIG. 9, an example of an MRI system 900 that can implement the methods described here is illustrated. The MRI system 900 includes an operator workstation 902 that may include a display 904, one or more input devices 906 (e.g., a keyboard, a mouse), and a processor 908. The processor 908 may include a commercially available programmable machine running a commercially available operating system. The operator workstation 902 provides an operator interface that facilitates entering scan parameters into the MRI system 900. The operator workstation 902 may be coupled to different servers, including, for example, a pulse sequence server 910, a data acquisition server 912, a data processing server 914, and a data store server 916. The operator workstation 902 and the servers 910, 912, 914, and 916 may be connected via a communication system 940, which may include wired or wireless network connections.

The pulse sequence server 910 functions in response to instructions provided by the operator workstation 902 to operate a gradient system 918 and a radiofrequency ("RF") system 920. Gradient waveforms for performing a prescribed scan are produced and applied to the gradient system 918, which then excites gradient coils in an assembly 922 to produce the magnetic field gradients $G_x$, $G_y$, and $G_z$ that are used for spatially encoding magnetic resonance signals. The gradient coil assembly 922 forms part of a magnet assembly 924 that includes a polarizing magnet 926 and a whole-body RF coil 928.

RF waveforms are applied by the RF system 920 to the RF coil 928, or a separate local coil to perform the prescribed magnetic resonance pulse sequence. The RF system 920 can include, or be in electrical communication with, the STAR system described in the present disclosure. Responsive magnetic resonance signals detected by the RF coil 928, or a separate local coil, are received by the RF system 920. The responsive magnetic resonance signals may be amplified, demodulated, filtered, and digitized under direction of commands produced by the pulse sequence server 910. The RF system 920 includes an RF transmitter for producing a wide variety of RF pulses used in MRI pulse sequences. The RF transmitter is responsive to the prescribed scan and direction from the pulse sequence server 910 to produce RF pulses of the desired frequency, phase, and pulse amplitude waveform. The generated RF pulses may be applied to the whole-body RF coil 928 or to one or more local coils or coil arrays.

The RF system 920 also includes one or more RF receiver channels. An RF receiver channel includes an RF preamplifier that amplifies the magnetic resonance signal received by the coil 928 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 910 may receive patient data from a physiological acquisition controller 930. By way of example, the physiological acquisition controller 930 may receive signals from a number of different sensors connected to the patient, including electrocardiograph ("ECG") signals from electrodes, or respiratory signals from a respiratory bellows or other respiratory monitoring devices. These signals may be used by the pulse sequence server 910 to synchronize, or "gate," the performance of the scan with the subject's heart beat or respiration.

The pulse sequence server 910 may also connect to a scan room interface circuit 932 that receives signals from various sensors associated with the condition of the patient and the magnet system. Through the scan room interface circuit 932, a patient positioning system 934 can receive commands to move the patient to desired positions during the scan.

The digitized magnetic resonance signal samples produced by the RF system 920 are received by the data acquisition server 912. The data acquisition server 912 operates in response to instructions downloaded from the operator workstation 902 to receive the real-time magnetic resonance data and provide buffer storage, so that data is not lost by data overrun. In some scans, the data acquisition server 912 passes the acquired magnetic resonance data to the data processor server 914. In scans that require information derived from acquired magnetic resonance data to control the further performance of the scan, the data acquisition server 912 may be programmed to produce such information and convey it to the pulse sequence server 910. For example, during pre-scans, magnetic resonance data may be acquired and used to calibrate the pulse sequence performed by the pulse sequence server 910. As another example, navigator signals may be acquired and used to adjust the operating parameters of the RF system 920 or the gradient system 918, or to control the view order in which k-space is sampled. In still another example, the data acquisition server 912 may also process magnetic resonance signals used to detect the arrival of a contrast agent in a magnetic resonance angiography ("MRA") scan. For example, the data acquisition server 912 may acquire magnetic resonance data and processes it in real-time to produce information that is used to control the scan.

The data processing server 914 receives magnetic resonance data from the data acquisition server 912 and processes the magnetic resonance data in accordance with instructions provided by the operator workstation 902. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 914 are conveyed back to the operator workstation 902 for storage. Real-time images may be stored in a data base memory cache, from which they may be output to operator display 902 or a display 936. Batch mode images or selected real time images may be stored in a host database on disc storage 938. When such images have been reconstructed and transferred to storage, the data processing server 914 may notify the data store server 916 on the operator workstation 902. The operator workstation 902 may be used by an operator to archive the images, produce films, or send the images via a network to other facilities.

The MRI system 900 may also include one or more networked workstations 942. For example, a networked workstation 942 may include a display 944, one or more input devices 946 (e.g., a keyboard, a mouse), and a processor 948. The networked workstation 942 may be located within the same facility as the operator workstation 902, or in a different facility, such as a different healthcare institution or clinic.

The networked workstation 942 may gain remote access to the data processing server 914 or data store server 916 via the communication system 940. Accordingly, multiple networked workstations 942 may have access to the data processing server 914 and the data store server 916. In this manner, magnetic resonance data, reconstructed images, or other data may be exchanged between the data processing server 914 or the data store server 916 and the networked workstations 942, such that the data or images may be remotely processed by a networked workstation 942.

As described above, systems and methods are provided for an RF power sampler to be used as the control device. In addition to the applications and uses described above, the control device can also be a probe that samples RF leakage power from the transmit side in an RF coil structure. This setup can also be used in a load-insensitive STAR system, thus, having the same impact of load changes on the sampled and received signal. Furthermore, the above described STAR systems and methods can be automatically controlled. For example, as described above, the STAR system can use remote and automatic control of gain and phase. Additionally, a wireless module can be used to receive commands and run such an automatic system. In the automatic STAR system, gain and phase control signals defined by a main controller (e.g., FPGA) can be adjusted and the minimum leakage signal level can be found by itself, for example, within 1 millisecond.

Figure 10:
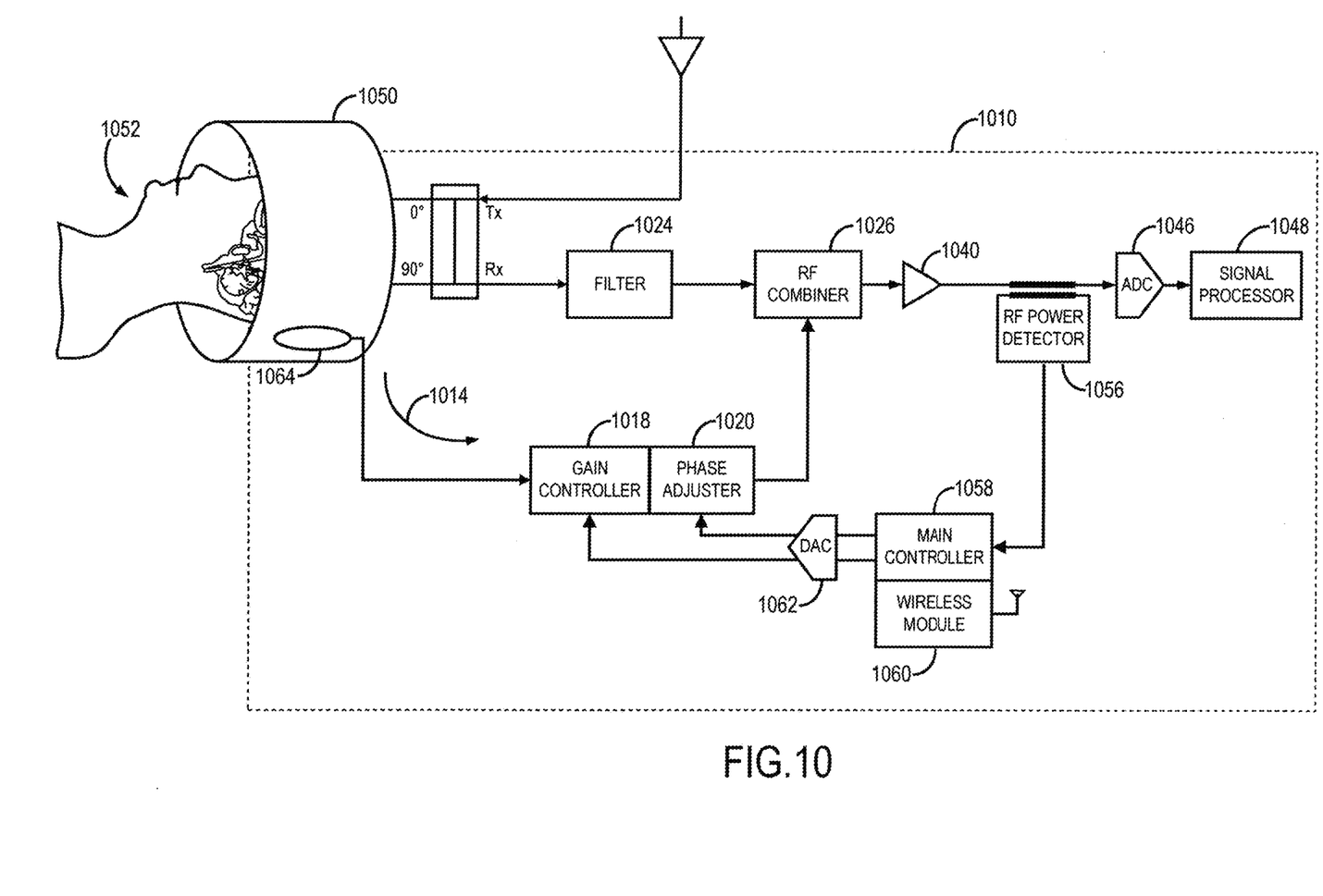
FIG. 10 is another example of a control system for simultaneous transmission and reception ("STAR") in nuclear magnetic resonance applications.

FIG. 10 illustrates an example STAR control system 1010 designed for real-time automatic tuning, matching, and isolation of the Tx and Rx signals. The STAR control system 1010 can operate as a standalone, wireless system without the need for operator input. The STAR control system 1010 generally includes a sampled RF leakage path 1014 for a cancelling signal that compensates for load variations in an RF coil 1050 in electrical communication with the STAR control system 1010. The sampled RF leakage path 1014 is similar to the feedback path of the STAR control system presented in FIG. 1 but differs, in part, because of its use of an RF leakage probe 1064 to compensate for load variations. As previously described, the load variations can be caused by motion of the subject 1052 being imaged by the RF coil; however, other load variations in the RF coil 1050 can also be compensated for by the STAR control system 1010.

The STAR control system 1010 includes an RF leakage signal probe 1064, a wireless module 1060, a main controller 1058, an RF power detector, a gain controller 1018; a phase adjuster 1020; a signal filter 1024; and an RF combiner 1026.

The RF leakage probe 1064 samples a leakage RF signal inside the RF coil 1050. This sampled RF leakage signal forms a cancelling signal that has its gain adjusted by the gain controller 1018, and its phase is adjusted by the phase adjuster 1020. The received RF signal is filtered by the filter 1024 before being combined with the adjusted cancelling signal at the RF power combiner 1026. When both combined RF signals have the same amplitude with a 180-degree phase shift, the RF leakage signal is minimized. When the adjusted cancelling signal, is close to the leakage signal, with a 180 degree phase shift, the resulting signal is minimized to be within the dynamic range of a low-noise amplifier ("LNA") 1040. Any residual leakage component present in the received RF signal may be removed by a digital cancelling algorithm in a signal processor 1048 after passing through an analog to digital converter 1046.

The main controller 1058 may comprise a Field Programmable Gate Array (FPGA) to control the adjustment of the gain control signal and phase control signal that are combined with the sampled RF leakage signal. These gain and phase control signals may be supplied from the main controller using one or more digital-to-analog converters (DACs) 1062. The STAR control system may also include an additional band-pass filter (not depicted) which can be symmetrized with the filter 1024 to produce a similar frequency response in the two signals combined in the RF combiner 1026.

An RF power detector 1056 is used after the combined signals pass through a low noise pre-amplifier 1040. The RF power detector 1056 utilizes a coupler to monitor RF leakage power levels according to each step of the gain and phase control. The main controller 1058 compares these power levels and searches for the minimum RF leakage power level. A wireless module 1060 can be used to send information or data relating to the RF leakage power levels, gain controller, and phase adjuster to one or more servers, such as the data acquisition server of FIG. 6. The one or more servers can then send commands back to the main controller 1058 through the wireless module 1060. These commands can include instructions to run, re-run, or stop the automatic function of the STAR control system.

The gain controller 1018 can include an attenuator, such as the RVA-2000 attenuator manufactured by Mini-circuit (New York, N.Y.); however, other suitable gain controllers known to those skilled in the art can also be used. The phase adjuster 1020 can be the SPHSA-251 phase adjuster manufactured by Mini-circuit (New York, N.Y.); however, other suitable phase adjusters known to those skilled in the art can also be used. The gain controller 1018 and phase adjuster 1020 are adjusted via a remote control system which communicates with the wireless module 1060. The wireless module can be a wireless transceiver module XBee S2C manufactured by Digi International; however, other suitable wireless modules known to those skilled in the art can also be used. The RF combiner 1026 preferably implements a symmetrical Wilkinson power combiner design; however, other power combiner designs can also be implemented. The output of the RF combiner is amplified by a low-noise amplifier ("LNA") 1040, such as the ZX60-P103LN LNA manufactured by Mini-circuit (New York, N.Y.); however, other suitable LNAs known to those skilled in the art can also be used.

Although there is no feedforward path stemming from the transmitter output signal or RF power sampler present in FIG. 10, one of skill in the art could envision modifying the STAR control system of FIG. 10 to include either or both of these control elements. Likewise, FIG. 1 does not include an RF leakage probe or automatic control elements such as the main controller or wireless module present in FIG. 10, but one of skill in the art could envision modifying the STAR control system of FIG. 1 to include these elements.

The present disclosure has provided a disclosure in terms of one or more preferred embodiments, and it should be appreciated that many equivalents, alternatives, variations, and modifications, aside from those expressly stated, are possible and within the scope of the invention.

The invention claimed is:

1. A control system for simultaneous radio frequency (RF) transmission and reception in nuclear magnetic resonance, comprising:
   a control device capable of generating a canceling signal indicative of variations in a load condition of an RF coil in electrical communication with the control device;
   a transmit port that communicates an RF transmit signal to an RF coil in electrical communication with the transmit port;
   a receive port for communicating nuclear magnetic resonance signals from an RF coil that is also in electrical communication with the transmit port;
   an RF combiner in electrical communication with the receive port and the control device, and that combines the nuclear magnetic resonance signals from the receive port with the cancelling signal generated by the control device to reduce signal components in the nuclear magnetic resonance signals attributable to mutually coupled transmit signal leakage in the receive port from the transmit port.

2. The control system as recited in claim 1, wherein the RF transmit signal is communicated to the transmit port while simultaneously receiving the nuclear magnetic resonance signals on the receive port.

3. The control system as recited in claim 1, wherein the control device is an RF power sampler that receives an RF transmit signal and generates therefrom a cancelling signal that includes a first signal component proportional to the RF transmit signal by a first coupling factor and a second signal component proportional to a reflected signal by a second coupling factor, the reflected signal being indicative of the variations in a load condition of an RF coil in electrical communication with the RF power sampler.

4. The control system as recited in claim 3, wherein the transmit port is in electrical communication with the RF power sampler and that receives the RF transmit signal from the RF power sampler.

5. The control system as recited in claim 1, further comprising a path that electrically connects the control device to the RF combiner, the path comprising:
a first bandpass filter that filters the cancelling signal;
a gain controller that adjusts a gain of the cancelling signal; and
a phase adjuster that adjusts a phase of the cancelling signal.

6. The control system as recited in claim 5, further comprising a second bandpass filter electrically connecting the receive port to the RF combiner, and that receives and filters the nuclear magnetic resonance signals from the receive port before the nuclear magnetic resonance signals are communicated to the RF combiner.

7. The control system as recited in claim 6, wherein the first bandpass filter and the second bandpass filter have a same passband such that the filtered nuclear magnetic resonance signals and the filtered cancellation signal have similar frequency responses.

8. The control system as recited in claim 5, wherein the gain controller and the phase adjuster are controllable to adjust the gain and phase of the compensation signal to maximize isolation between the transmit port and the receive port.

9. The control system as recited in claim 8, further comprising a remote controller that controls the gain controller and the phase adjuster, the remote controller comprising:
a main controller in wireless communication with the gain controller and the phase adjuster, the main controller configured to control the gain adjustment of the gain controller and the phase adjustment of the phase controller;
an RF power detector in electrical communication with the main controller, wherein the RF power detector provides information to the main controller regarding the combined signal from the RF combiner; and
a wireless module in electrical communication with the main controller, wherein the wireless module allows the main controller to wirelessly communicate with a server and the server provides operating commands to the main controller.

10. The control system as recited in claim 4, wherein RF power sampler comprises a first coupling and a second coupling, wherein the first coupling samples the RF transmit signal to generate the first signal component and the second coupling samples the RF transmit signal to generate the second signal component.

11. The control system as recited in claim 1, wherein the transmit signal has a peak RF power less than 1 W.

12. The control system as recited in claim 1, further comprising a signal processor that separates the residual leakage signal and the nuclear magnetic resonance signals using a digital cancelling algorithm.

13. The control system as recited in claim 1, wherein the control device is a probe that generates the canceling signal from sampled signals attributable to mutually coupled transmit signal leakage in the receive port from the transmit port.

14. A method for producing an image with a magnetic resonance imaging (MRI) system while simultaneously transmitting and receiving radio frequency (RF) signals, the steps of the method comprising:
(a) generating a cancelling signal with a control device, the cancelling signal indicative of variations in a load condition of an RF coil in electrical communication with the control device;
(b) transmitting an RF excitation field to an object with an RF coil using the RF transmit signal;
(c) receiving nuclear magnetic resonance signals from the object using the RF coil while the RF excitation is being transmitted;
(d) combining the nuclear magnetic resonance signals with the cancelling signal to generate compensated nuclear magnetic resonance signals in which signal components in the nuclear magnetic resonance signals attributable to mutually coupled transmit signal leakage in a receive port of the RF coil from a transmit port of the RF coil are minimized; and
(e) producing an image of the object from the compensated nuclear magnetic resonance signals.

15. The method as recited in claim 14, wherein the RF excitation field includes a continuous wave RF excitation.

16. The method as recited in claim 14, wherein generating a cancelling signal with a control device includes providing an RF transmit signal to an RF power sampler to generate therewith the canceling signal, wherein the canceling signal includes a first signal component proportional to the RF transmit signal by a first coupling factor and a second signal component proportional to a reflected signal by a second coupling factor, the reflected signal being indicative of the variations in a load condition of the RF coil in electrical communication with the RF power sampler.

17. The method as recited in claim 14, wherein generating a cancelling signal with a control device includes using a probe that generates the canceling signal from sampled signals attributable to mutually coupled transmit signal leakage in the receive port from the transmit port.

18. The method as recited in claim 14, further comprising an additional step that includes adjusting a gain of the cancelling signal using a gain control signal from a gain controller and adjusting a phase of the cancelling signal using a phase control signal from a phase adjuster, wherein the additional step occurs prior to step (d).

19. The method as recited in claim 18, wherein adjusting the gain and phase of the cancellation signal occurs automatically and without operator input.

20. The method as recited in claim 18, wherein the RF excitation field is a continuous RF sweep excitation and the gain control signal and phase control signal are adjusted at each frequency to improve the effectiveness of the cancelling signal.

* * * * *